(12) United States Patent
Winters

(10) Patent No.: US 7,195,949 B2
(45) Date of Patent: Mar. 27, 2007

(54) PROVIDING DRIVING CURRENT ARRANGEMENT FOR OLED DEVICE

(75) Inventor: Dustin L. Winters, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/405,250

(22) Filed: Apr. 17, 2006

(65) Prior Publication Data

US 2006/0186402 A1   Aug. 24, 2006

Related U.S. Application Data

(62) Division of application No. 10/945,484, filed on Sep. 20, 2004, now Pat. No. 7,105,855.

(51) Int. Cl.
*H01L 51/40* (2006.01)

(52) U.S. Cl. .......... 438/99; 257/E21.413; 257/E21.703

(58) Field of Classification Search .................. 438/99; 257/E21.413

See application file for complete search history.

(56) References Cited

U.S. PATENT DOCUMENTS

| | | | |
|---|---|---|---|
| 4,356,429 A | 10/1982 | Tang | |
| 5,276,380 A | 1/1994 | Tang | |
| 5,550,066 A | 8/1996 | Tang et al. | |
| 5,942,856 A | 8/1999 | Koyama | |
| 6,281,634 B1 | 8/2001 | Yokoyama | |
| 6,456,013 B1 | 9/2002 | Komiya et al. | |
| 6,501,466 B1 | 12/2002 | Yamagishi et al. | |
| 6,535,185 B2 | 3/2003 | Kim et al. | |
| 6,548,867 B2 | 4/2003 | Yamada et al. | |
| 6,608,620 B1 * | 8/2003 | Suzuki et al. | 345/204 |
| 6,753,654 B2 | 6/2004 | Koyama | |
| 6,888,304 B2 * | 5/2005 | Sato | 313/498 |
| 6,963,173 B2 * | 11/2005 | Kawachi et al. | 315/169.2 |
| 6,977,463 B2 * | 12/2005 | Sato | 313/498 |
| 2001/0015626 A1 * | 8/2001 | Ozawa | 315/169.1 |
| 2003/0142046 A1 | 7/2003 | Kasai et al. | |
| 2003/0151568 A1 * | 8/2003 | Ozawa | 345/82 |
| 2003/0193493 A1 * | 10/2003 | Ozawa | 345/204 |

(Continued)

FOREIGN PATENT DOCUMENTS

| | | |
|---|---|---|
| EP | 1 220 191 | 7/2002 |
| JP | 2003-007720 | 1/2003 |

*Primary Examiner*—B. William Baumeister
*Assistant Examiner*—Igwe U. Anya
(74) *Attorney, Agent, or Firm*—Raymond L. Owens

(57) ABSTRACT

A method of making a current type active matrix OLED device, includes providing a semiconductor layer, a conductive layer, and an insulator layer therebetween over a substrate, providing an organic light emitting diode over either the semiconductor layer or over the conductive layer for each pixel, and forming a first transistor having a channel region formed in the semiconductor layer and a gate formed in the conductive layer for each pixel for receiving a first current data signal for adjusting the emission brightness in its corresponding pixel. The method also includes forming a second transistor for each pixel for regulating current through the organic light emitting diode in response to the first current wherein each second transistor has a gate formed in the conductive layer and a channel region formed in the semiconductor layer, and annealing particular regions of the semiconductor layer by using a pulsed laser.

12 Claims, 6 Drawing Sheets

U.S. PATENT DOCUMENTS

| | | |
|---|---|---|
| 2003/0230750 A1 | 12/2003 | Koyama et al. |
| 2004/0135150 A1 | 7/2004 | Sato et al. |
| 2004/0144978 A2 | 7/2004 | Koyama |
| 2004/0233147 A1* | 11/2004 | Kawachi et al. ............... 345/82 |
| 2005/0007322 A1* | 1/2005 | Adachi et al. ................. 345/82 |

* cited by examiner

PROVIDING DRIVING CURRENT ARRANGEMENT FOR OLED DEVICE

CROSS REFERENCE TO RELATED APPLICATIONS

This is a Divisional of U.S. Ser. No. 10/945,484, filed Sep. 20, 2004 now U.S. Pat. No. 7,105,855 by Dustin L. Winters.

FIELD OF INVENTION

The present invention relates to organic electroluminescent devices. More specifically, this invention relates to current type active matrix pixel circuitry for organic electroluminescent devices.

BACKGROUND OF THE INVENTION

In the simplest form, an organic electroluminescent (EL) device is comprised of an anode for hole injection, a cathode for electron injection, and an organic medium sandwiched between these electrodes to support charge recombination that yields emission of light. These devices are also commonly referred to as organic light emitting diodes, or OLEDs. A basic organic EL element is described in U.S. Pat. No. 4,356,429. In order to construct a pixelated OLED device such as is useful, for example, as a television, computer monitor, cell phone display, or digital camera display, individual organic EL elements can be arranged as pixels in a matrix pattern. These pixels can all be made to emit the same color, thereby producing a monochromatic device, or they can be made to produce multiple colors such as a red, green, blue (RGB) device.

The simplest pixelated OLED devices are driven in a passive matrix configuration. In a passive matrix, the organic EL material is sandwiched between two sets of orthogonal electrodes (rows and columns). An example of a passive matrix driven organic EL device is described in U.S. Pat. No. 5,276,380. This approach to producing a pixelated device, however, has several disadvantages. First, only a single row (or column) is illuminated at any given time. Therefore, in order to achieve the desired average brightness for a given frame of video, the row should be illuminated to an instantaneous brightness equal to the desired average brightness multiplied by the number of rows. This results in higher voltages and reduced long term reliability compared to a situation where the pixels are capable of being lit continuously for the entire frame. Second, the combination of high instantaneous current and electrodes that are long and narrow, and therefore have high resistance, results in significant voltage drops across the device. These variations in voltage across the display adversely affect brightness uniformity. These two effects become worse as the size of the display and number of rows and columns are increased, thereby limiting passive matrix designs to relatively small, low resolution displays.

To resolve these problems and produce higher performance devices, recent OLED device designs are typically driven by active matrix (AM) circuitry. In an active matrix configuration, each pixel is driven by multiple circuit elements such transistors, capacitors, and signal lines. This circuitry permits for the pixels of multiple rows to remain illuminated simultaneously, thereby decreasing the required peak brightness of each pixel.

Early active matrix devices, such as those described in U.S. Pat. Nos. 5,550,066, 6,281,634, and 6,456,013, employ a voltage driven type pixel circuit. A voltage drive type active matrix circuit controls the brightness level of the pixels using a voltage data signal. The voltage signal is converted to a current by one or more drive transistors within each pixel. A drive transistor is a transistor which has its source and drain terminals electrically connected between the organic EL element and a power connection (or power line) and which regulates the current flow through the organic EL element in response to a voltage applied to its gate terminal.

These OLED devices are typically mass produced on large substrates with several panels fabricated simultaneously on a single substrate. A typical substrate is made of glass. The transistors are therefore commonly formed in thin film layers of semiconductor material such as silicon. Transistors constructed in thin films of silicon are commonly known as thin film transistors (TFT's). This silicon is typically deposited as an amorphous film. In order to improve the mobility of the silicon, the silicon can be annealed to form polycrystalline silicon, also known as polysilicon. One common process used to perform the annealing is to irradiate the silicon layer with a laser. One such laser annealing process is known as excimer laser annealing (ELA). An example OLED device having laser annealed thin film transistor is described in U.S. Pat. No. 6,548,867.

However, when the transistors are fabricated as thin films, the amount of variation of the properties of the transistors is large. In an OLED device, the brightness of an organic EL element is controlled by the current density flowing through the organic EL element. Variations in the characteristics of the pixel transistors such as mobility and threshold voltage can directly impact the current flowing through the organic EL element, which in turn affects pixel brightness. Variation across the OLED device can result in nonuniform brightness or coloring of the device.

In order to obtain more uniform brightness from an OLED device given variability in the transistor manufacturing process, new designs have been introduced which are current drive type active matrix pixel circuits. A current drive type active matrix circuit controls the brightness level of the pixels using a current data signal. In a current type active matrix pixel circuit, the data signal is in the form of a current signal unlike the voltage signal used in the voltage type active matrix circuits.

Examples of a current type active matrix pixel circuit are the current mirror type pixel circuit disclosed in U.S. Pat. Nos. 6,501,466, 6,535,185, 6,753,654, and U.S. Patent Application Publication 2004/0144978 A2. Current mirror type pixels use a current data source that passes a first current through a first transistor (or conversion transistor) in each pixel. The gate terminal of the first transistor is electrically connected to the gate terminal of a second transistor that has either its source or drain terminal electrically connected to the organic EL element and serves as the drive transistor. This electrical connection to the organic EL element can be either direct as is shown in U.S. Pat. Nos. 6,501,466 and 6,535,185, or indirectly through another transistor as shown in U.S. Patent Application Publication 2004/0144978 A2. The current supplied through the first transistor is then mirrored onto the second transistor by nature of their connected gate terminals thereby establishing a second current. This second current can be equal to the first current or set to some ratio of the first current.

By use of this current mirror design, the need to maintain tight control of the pixel to pixel variability in the characteristics such as threshold voltage and mobility of the drive transistors is reduced. This facilitates use of thin film transistor fabrication techniques and the fabrication of large area devices. However, differences within a pixel between the characteristics of the drive transistor and the transistor having its gate terminal connected to the drive transistor's gate terminal can still result in variable brightness output. In order to reduce this brightness variability of the OLED device, the variability between these two transistors within each pixel should be reduced. Therefore, an improved pixel design with reduced variability is required.

SUMMARY OF THE INVENTION

It is an object of this invention to make a current type active matrix OLED device with improved pixel brightness uniformity.

These objects are achieved by a method of making a current type active matrix OLED device, comprising:

a) providing a semiconductor layer over a substrate;

b) providing a conductive layer over the substrate;

c) providing an insulator layer between the semiconductor layer and the conductive layer;

d) providing an organic light emitting diode over either the semiconductor layer or over the conductive layer for each pixel for producing light emission;

e) forming a first transistor having a channel region formed in the semiconductor layer and a gate formed in the conductive layer for each pixel for receiving a first current data signal for adjusting the emission brightness in its corresponding pixel;

f) forming a second transistor for each pixel for regulating current through the organic light emitting diode in response to the first current wherein each second transistor has a gate formed in the conductive layer and a channel region formed in the semiconductor layer; and g) annealing regions of the semiconductor layer before or after formation of the first and second transistors by using a pulsed laser providing one or more laser pulses provided by a source that irradiates such regions of the semiconductor layer associated with a portion of the channel region of the first transistor and a portion of the channel region of the second transistor.

DETAILED DESCRIPTION OF THE INVENTION

Figure 1:
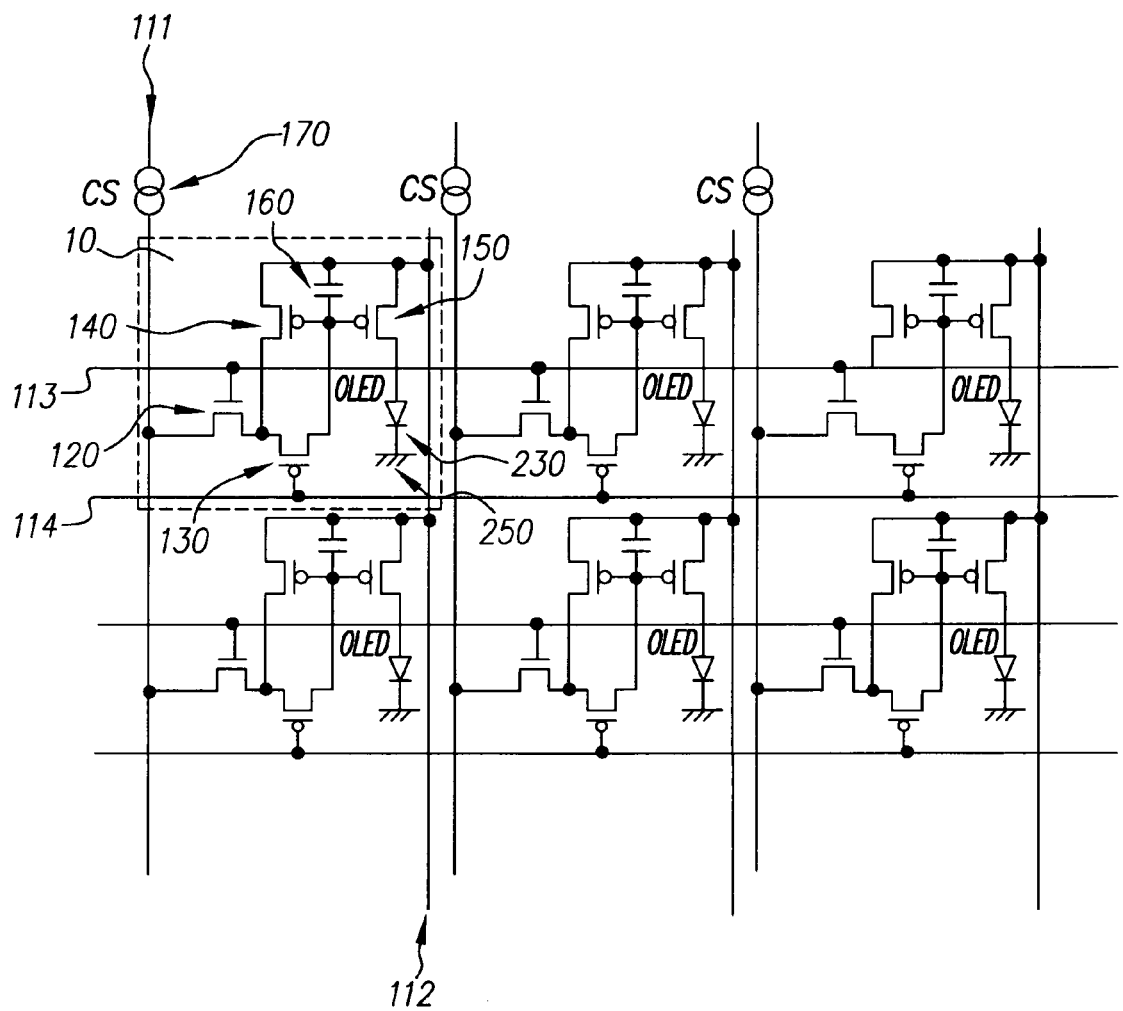
FIG. 1 shows a prior art schematic circuit diagram of a driving arrangement for a current type active matrix OLED device.

FIG. 1 shows a prior art current type active matrix circuit for driving an OLED device. More particularly, this diagram depicts an active matrix, current mirror type circuit. See U.S. Pat. No. 6,501,466. The circuit is arranged into a matrix of pixels, such as pixel 10, which are arranged into rows and columns. Each pixel is an area of the device that can be independently stimulated to produce light. These pixels can all produce light of the same color, thereby forming a monochromatic device, or produce light of different colors, thereby forming a multicolor device such as an RGB device. Each column includes a data line, such as data line 111 that is connected to a current source, such as current source 170. This current source can be fabricated on the same substrate as the pixels or fabricated externally and connected to the data line 111. Each column also includes a power line such as power line 112. Alternately, neighboring columns of pixels can be arranged to share a single power line. In yet another alternate arrangement, these power lines can be arranged to run perpendicular to the data lines or in the direction of the rows. Each row includes a first scan line such as first scan line 113 and a second scan line such as second scan line 114. Each pixel further includes four transistors, a capacitor, and an organic light emitting diode. For example, pixel 10 includes select transistor 120, switch transistor 130, conversion transistor 140, drive transistor 150, storage capacitor 160, and organic light emitting diode 230.

The select transistor 120 is electrically connected at its gate terminal to the first scan line 113 and is electrically connected at either its source or drain terminal to the data line 111. The function of the select transistor is to permit the data, which is supplied in the form of a current signal, to pass from the data line to the other circuit components when the select transistor is turned on by the appropriate voltage on the first scan line. In doing so, the current flow through the drive transistor, and therefore the organic light emitting diode, is adjusted thereby adjusting the brightness of the pixel. The select transistor can also be referred to as the input transistor.

The switch transistor 130 is electrically connected at its gate terminal to the second scan line 114 and at its second terminal to the select transistor 120 and at its third terminal to the storage capacitor 160, the gate terminals of the drive transistor 150, and the gate terminal conversion transistor 140 as shown. The purpose of the switch transistor is to permit the gate terminals of the drive and conversion transistors as well as the storage capacitor to charge to the desired brightness when the data signal is being written to the pixel. This is accomplished by applying the appropriate voltage to the gate terminal of the switch transistor by means of the second scan line to turn the switch transistor on. After the data signal has been written, the switch transistor is turned off by applying an appropriate voltage to the second scan line, thereby isolating the voltage stored on the storage capacitor and the gate terminals of the conversion and drive transistors. The switch transistor can also be referred to as the erase transistor.

The conversion transistor 140 is electrically connected at its gate terminal to the storage capacitor 160 and the gate terminal of the drive transistor 150 as well as the source or drain terminal of the switch transistor 130. The second terminal of the conversion transistor is electrically connected to the power line 112 and the third terminal is electrically connected to the source or drain of the select transistor 120 and the switch transistor 130 as shown. The purpose of the conversion transistor is to pass the current supplied by the data line and to mirror the current onto the drive transistor by electrically connecting the gate of the conversion transistor to gate of the drive transistor. If the features of the conversion transistor and drive transistor are identical, then the mirrored current will be approximately identical to the current supplied by the data line. These features include the transistors' channel lengths, channel widths, and gates insulator thickness. However, it is preferable that the current through the drive transistor is not identical, but instead is in a predetermined ratio relationship relative to the data line current. It is preferable, for example, that a higher current is supplied by the data line so that the storage capacitor and other capacitances, such as parasitic capacitances, are quickly charged thereby reducing the time required to establish the desired brightness level of the pixel. This is achieved by adjust the ratios of one or more of the features of the conversion and drive transistors such as the ratio of the channel lengths, channel widths, and gate insulator thickness. For example, if the gate width of the conversion transistor is made to be a factor of ten times larger than that of the gate width of the drive transistor while the other features are made to be equivalent, then a current of approximately ten times greater than that which is required by the organic light emitting diode to achieve the desired pixel brightness can be used to write the pixel data. After the brightness level has been adjusted to the desired level and the select transistor and switch transistors are turned off, the current flow through the conversion transistor ceases and it no longer serves its current mirror function. However, because the voltage at the gate terminal of the drive transistor is stored on the storage capacitor and isolated by the switch transistor, the pixel continues to emit at the desired brightness with the drive transistor supplying the required current. This continues until the pixel is again adjusted during the next image frame.

The drive transistor 150 is electrically connected at its gate terminal to the storage capacitor 160 and to the gate terminal of the conversion transistor 140 as well as to the source or drain terminal of the switch transistor 130. The drive transistor is electrically connected at its second terminal to the power line 112 and at its third terminal to the organic light emitting diode 230 as shown. The purpose of the drive transistor is to regulate current flow through the organic light emitting diode in response to data signal from the data line. In this case, the regulated current flow can be some predetermined ratio relationship of that supplied by the data line as converted by the conversion transistor as described above. The drive transistor can also be referred to as a power transistor.

Each pixel, such as pixel 10, includes an organic light emitting diode, such as organic light emitting diode 230. These diodes are composed of organic light emitting layers disposed between a first and second electrode. The first electrode is connected to drive transistor 150. The second electrode 250 is preferably common to all the pixels. One or more of the organic light emitting layers can be individually patterned for each pixel, or can be common to all the pixels as well.

The first scan line 113 and second scan line 114 are used to turn on the select transistor 120 and switch transistor 130, respectively, permitting the pixel to adjust in brightness in response to the data signal from the data line 111 during a write period of the device frame. After the brightness level is established, the first scan line and second scan line are set to turn off the select and switch transistors for their associated row of pixels. The data line signal is then adjusted to the desired level for the next row and then the first scan line and second scan line for that next row are activated. This process is repeated for each row of pixels. In this configuration, the select transistor is shown to be an NMOS type transistor and the conversion transistor, the drive transistor, and the switch transistor are shown to be PMOS type transistors. However, the present invention is not limited to this case and these transistor types can be reconfigured by someone skilled in the art. In alternate designs, particularly where the select transistor and switch transistor are made to both be NMOS or PMOS type transistors, a single scan line can serve the function of both the first scan line and second scan line. Such a design is shown in U.S. Pat. No. 6,535,185.

Figure 2:
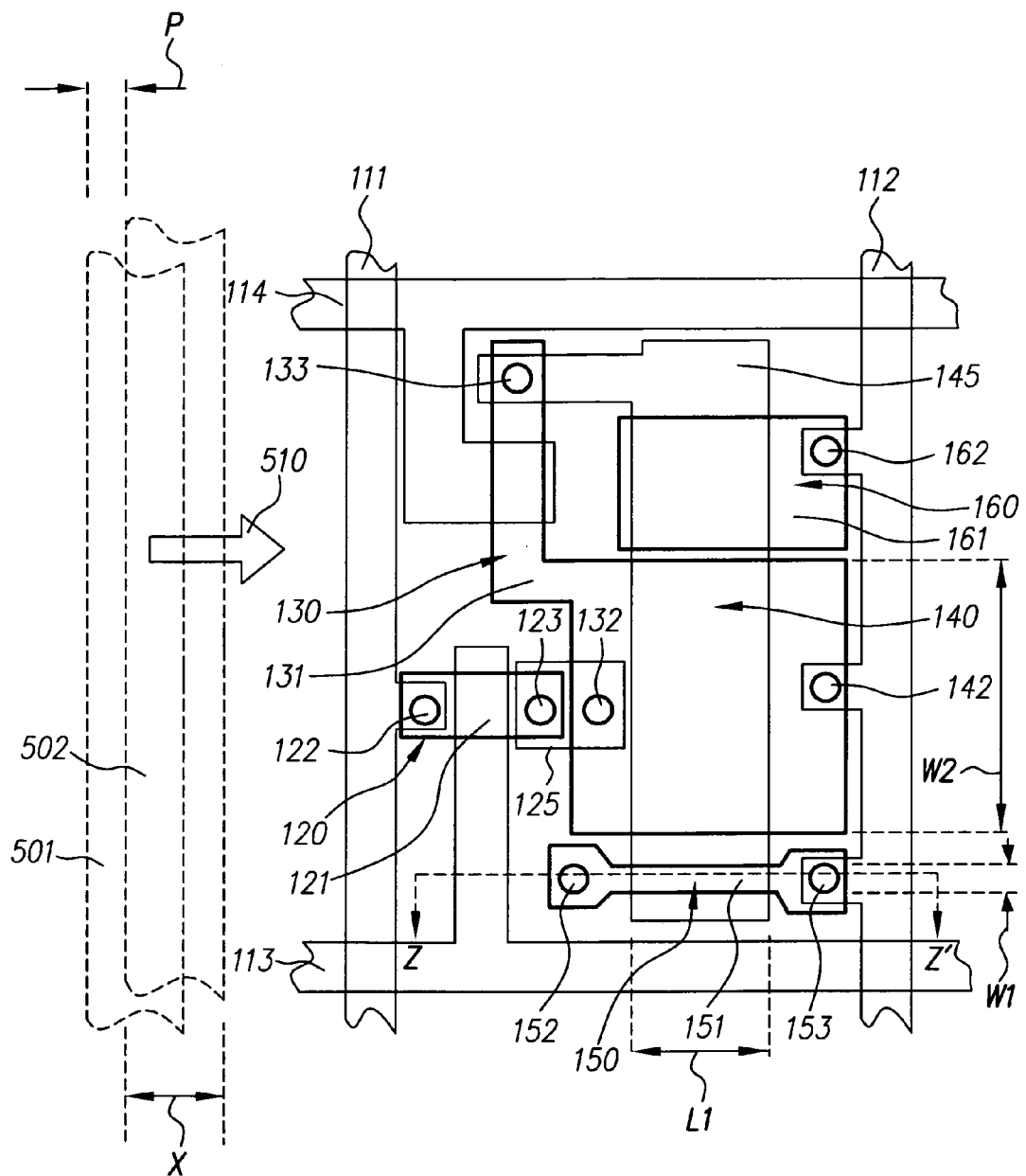
FIG. 2 shows a circuit layout diagram of a pixel according to the first layout embodiment of the present invention.

FIG. 2 shows an current type active matrix circuitry layout diagram for a single pixel according to the first layout embodiment of the present invention. In FIG. 2, the construction and the arrangement of the various circuit components such as the select transistor 120, the switch transistor 130, the conversion transistor 140, the drive transistor 150, the storage capacitor 160, the data line 111, the power line 112, the first scan line 113, and the second scan line 114 is shown. The organic light emitting diode, including its first electrode and second electrode, are not shown in FIG. 2.

The transistors, such as select transistor 120, switch transistor 130, conversion transistor 140, and drive transistor 150 are formed from a semiconductor layer. This semiconductor layer is preferably silicon. The semiconductor layer can be amorphous, crystalline, or polycrystalline, although it is preferably polycrystalline or crystalline so as to have a high carrier mobility. In the case of an amorphous film, all of the transistors should instead be made to be of the NMOS type since hole mobility in amorphous films is very low making use of PMOS transistors less practical. For the preferred case of a polycrystalline or crystalline semiconductor, both NMOS and PMOS transistors can be used as shown in FIG. 1. The semiconductor layer can be formed of one or more sublayers which can be either doped or intrinsic. The semiconductor layer is patterned into regions such as semiconductor region 121, semiconductor region 131, and semiconductor region 151. These regions are patterned using techniques known in the art such as photolithographic patterning of a photoresist followed by etching in a solution or plasma. These regions or portions of these regions can be selectively further doped to be N or P type prior to or following pattering into regions. This is accomplished by using techniques known in the art for doping such as ion implantation.

One method of forming the semiconductor layer involves depositing the semiconductor layer in an amorphous state and crystallizing the semiconductor layer by annealing by a laser. This laser process of crystallization can be achieved by providing a laser source which produces laser pulses and moving the laser source relative to the substrate in a stepped manner. A variety of different laser sources are known in the art which are useful for such cystallization process. A typical source includes a laser, such as a XeCl laser, and a set of optical elements, such as lenses, for focusing the laser into a shaped beam. Such a process of stepped laser annealing is described in U.S. Pat. No. 6,548,867. The laser pulse is formed into a rectangular shape having a pulse width X and the step movement occurs with a pitch P. Two such consecutive pulses are indicated in FIG. 2 as laser pulse 501 and laser pulse 502. Laser pulse 501 and laser pulse 502 are two sample pulses from a series of pulses moving in laser scan direction 510. Many pulses (not shown) preceding and following laser pulse 501 and laser pulse 502 are used to crystallize all semiconductor regions of all pixels on the substrate. The laser pulses are preferably longer than a single pixel, as such the entire length of a pulse is not shown. The laser pulse steps are preferably made to overlap, such that the annealed areas of the semiconductor layer receive multiple pulses of the laser. As such, the pitch is preferably less than the laser pulse width. Although it is desirable to maintain a constant laser energy as the laser is pulsed and moved across the substrate, some variability can still occur. Such variability will impact the properties of the thin film transistors. Variability of the laser energy can also occur within a pulse along the length of the pulse.

Select transistor 120 is formed from semiconductor region 121. The gate of select transistor 120 is formed by extending a portion of the first scan line 113 over a portion of semiconductor region 121. The first scan line 113 and the second scan line 114 are formed and patterned in a first conductor layer. Between the first conductor layer and the semiconductor layer, an insulating layer (not shown) is disposed which forms the gate dielectric of the transistors. Source and drain regions can be formed for select transistor 120 by doping the semiconductor region 121 on either side of the gate formed by the extension of the first scan line 113.

Data line 111 and power line 112 are formed and patterned using techniques known in the art from a second conductor layer. Between the second conductor layer and the first conductor layer, another insulator layer (not shown) is disposed. This permits for the lines formed in the first conductor layer and the second conductor layer to cross without forming electrical contact thereby enabling the formation of the rows and columns of the matrix of pixels. The select transistor 120 is connected to the data line 111 by forming via 122 in the insulating layers between the semiconductor region 121 and the data line 111. This via is formed using techniques known in the art such as photolithographic patterning and etching.

The switch transistor 130 is formed from semiconductor region 131. The gate of the switch transistor 130 can be formed by extending a portion of the second scan line 114 over a portion of the semiconductor region 131 as shown. Source and drain regions can be formed by doping portions of the semiconductor region 131 on either side of this gate. Connection is made between the switch transistor 130 and the select transistor 120 by using a conductor bridge 125 connected to the semiconductor region 121 through via 123 and the semiconductor region 131 through via 132. The conductor bridge can be formed, for example, in the second conductor layer. This conductor bridge is preferred because these transistors are different types, NMOS and PMOS, but is not always required for successful implementation of the invention. Connection is also made here to conversion transistor 140 by the fact that conversion transistor 140 is also formed from a portion of the semiconductor region 131. Alternately, another conductor bridge can be used to make these connections and the conversion transistor can be separated into its own semiconductor region. Switch transistor 130 is electrically connected to gate conductor 145 through via 133. Gate conductor 145 forms one side of storage capacitor 160 as well as the gate electrode for conversion transistor 140 and drive transistor 150. In this way, electrical connection is formed between the storage capacitor 160 and the gates of the conversion transistor 140 and the drive transistor 150. Gate conductor 145 is preferably constructed in the same layer as the gate of the select transistor 120 and the switch transistor 130. That is, for example, gate conductor 145 is preferably constructed in the first conductor layer.

Storage capacitor 160 is preferably constructed between semiconductor region 161 and the gate conductor 145 as shown. That is, the storage capacitor is formed from the first conductor layer and the semiconductor layer with a dielectric layer (not shown) disposed between these layers. In this configuration, the semiconductor region 161 is electrically connected to the power line 112 through via 162. Alternately, the storage capacitor can be formed from other layers such as the first and second conductor layers. In this alternate configuration, one side of the capacitor can be formed by extending a portion of the power line, thereby providing electrical contact to the power line and avoiding the need to form a via.

Conversion transistor 140 is formed from the semiconductor region 131 and its gate is formed from gate conductor 145 as described above. Source and drain regions can be formed by doping portions of the semiconductor region 131 on either side of gate conductor 145. Electrical connection is made between conversion transistor 140 and the power line 112 through via 142 as shown.

Drive transistor 150 is formed from the semiconductor region 151 and its gate is formed from gate conductor 145. Source and drain regions can be formed by doping portions of the semiconductor region 151 on either side of gate conductor 145. Electrical connection is made between drive transistor 150 and the power line 112 through via 153 as shown. Drive transistor 150 is also electrically connected to the first electrode (not shown) of the organic light emitting diode through via 152. The first electrode (not shown) of the organic light emitting diode is preferably constructed from a third conductor layer disposed above the second conductor layer. The third conductor layer and second conductor layer are separated by a dielectric layer (not shown). Via 152 is an opening formed in this dielectric layer thereby permitting electrical contact.

Each transistor is formed with a channel region under its gate terminal, which connects the transistor's source and drain. This channel region has a length and a width. Current flows through the channel in response to an applied voltage difference between the source terminal and the gate terminal. This current increases approximately proportionally with increased width of the channel and decreases proportionally with increased length of the channel. When the transistor is operated in the saturation regime, this current approximately follows Equation 1.

$$I_{SD} = \frac{1}{2} \times \mu \times \frac{W}{L} \times C_{Gate} \times (V_{GS} - V_{TH})^2 \quad \text{(Equation 1)}$$

where:

$I_{SD}$ is the current flowing between the source and drain terminals;

$\mu$ is the mobility of the carrier such as electrons or holes;

W is the channel width;

L is the channel length;

$C_{Gate}$ is the capacitance per unit area of the gate over the channel region;

$V_{GS}$ is the voltage difference between the gate terminal and the source terminal; and $V_{TH}$ is the threshold voltage of the transistor.

The current flowing through the organic light emitting diode is regulated by drive transistor 150. Drive transistor 150 has a channel length indicated as L1 and a channel width indicated as W1. Similarly, conversion transistor 140 has a channel width indicated as W2 and is shown as having the same channel length L1 and drive transistor 150. The current flow through drive transistor 150 and conversion transistor 140 can be designed to be equal or a particular ratio.

In order to achieve a ratio of currents, one or more of the parameters, such as channel length or channel width, which determine current flow according to Equation 1, need to be different between the conversion transistor and the drive transistor. As shown in FIG. 2, the channel width of the conversion transistor and drive transistor can be made to be different while the channel length is made to be the same. In this configuration, it is preferable that the other parameters such as mobility, threshold voltage, and capacitance per unit area of the gate over the channel region be made to be the same. Therefore, it is important that the properties of the semiconductor regions for these two transistors have a minimum amount of variability.

In order to reduce variability between the semiconductor regions in the channel regions of the conversion transistor 140 and the drive transistor 150 when annealing the semiconductor layer using a laser, these two regions should be crystallized by the same laser pulse or series of laser pulses. As such, the channel regions of the conversion transistor 140 and the drive transistor 150 are disposed with respect to the laser pulses such that they are both within the length of a pulse and annealed by the same series of pulses at the same instances. The channel regions of the conversion transistor 140 and the drive transistor 150 are also disposed such that as the series of pulses traverses the channel regions as indicated by the scan direction 510. The series of pulses will reach both channel regions at approximately the same instant and finish annealing both channel regions at approximately the same instant. This can be achieved, for example, by disposing the channel regions as shown such that either the length or the width of channel regions are perpendicular to the laser pulses and so that the channel regions are appropriately aligned to each other. In order to achieve this alignment of the channel regions of the conversion transistor 140 and the drive transistor 150, it is preferable that either the length or the width of the conversion transistor 140 and the drive transistor 150 are made to be the same. As shown in the example of FIG. 2, the channel lengths of the channel regions of the conversion transistor 140 and the drive transistor 150 are made to be the same while the channel widths of these regions are made to be different. While it is preferable that 100% of the channel regions are annealed by exactly the same series of pulses, some benefit can still be achieved by disposing these channel regions such that at least a portion of each of the channel regions, preferably more than 50%, are simultaneously annealed by the same pulses. Furthermore, in order to reduce sensitivity to variability in the laser pulse energy along the length of the laser pulse, the spacing between the channel regions of the drive transistor 150 and the conversion transistor 140 are preferably reduced by disposing the drive transistor 150 and the conversion transistor 140 close together as shown.

Figure 3:
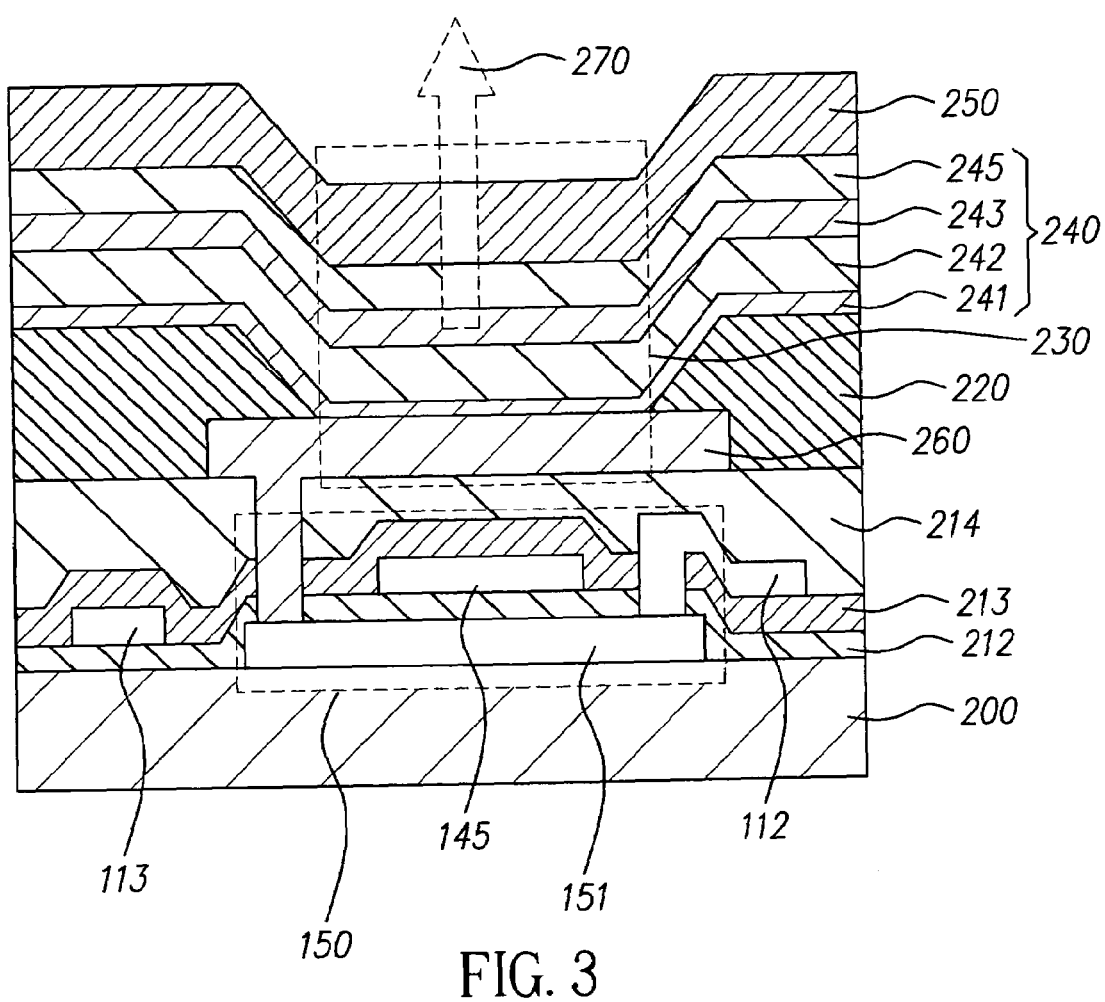
FIG. 3 shows a cross section view of an OLED device taken along the line Z–Z' of FIG. 2 according to the present invention.

A cross sectional view of the device of FIG. 2 along line Z–Z' is shown in FIG. 3. This view illustrates a cross section of drive transistor 150. Drive transistor 150 is formed on substrate 200. Many materials can be used for substrate 200 such as, for example, glass, plastic, ceramic, and metal foils. The substrate can be further covered with one or more barrier layers (not shown). If the substrate is conductive, it can be further coated with a dielectric layer (not shown). If the device is intended to be operated such that light produced by the pixels is viewed through the substrate, the substrate should be transparent. This configuration is known as a bottom emitting device. In this case, materials for the substrate such as glass or transparent plastics are preferred. If the device is intended to be operated such that light produced by the pixels is viewed in the direction opposite of the substrate, then substrates that are opaque can be used. This configuration is known as a top emitting device. The example shown in FIG. 3 is a top emitting device, however, the present invention is not limited to this case.

Above substrate 200 a first semiconductor layer is provided, from which semiconductor region 151 is formed. Above semiconductor region 151, first dielectric layer 212 is formed by methods such as photolithography and etching. This dielectric layer is preferably silicon dioxide, silicon nitride, or a combination thereof. It can also be formed from several sublayers of dielectric material. Above first dielectric layer 212, a first conductor layer is provided, from which gate conductor 145 and first scan line 113 are formed by methods such as photolithography and etching. This conductor layer can be, for example, a metal such as chromium, as is known in the art. Above gate conductor 145 and first scan line 113, a second dielectric layer 213 is formed. This dielectric layer can be, for example, silicon dioxide, or silicon nitride, or a combination thereof. Above second dielectric layer 213, a second conductor layer is provided, from which power line 112 is formed by methods such as photolithography and etching. This conductor layer can be, for example, a metal such as an aluminum alloy as is known in the art. Power line 112 makes electrical contact with semiconductor region 151 through vias opened in the dielectric layers. Over the second conductor layer, a third dielectric layer 214 is formed.

Above the third dielectric layer, a first electrode 260 is formed. First electrode 260 is preferably highly reflective for a top emitting device. As such, first electrode can be a metal layer such as Al or Ag. Alternately, the first electrode can be comprised of multiple sublayers such as a transparent indium tin oxide (ITO) over a reflective layer such as Ag or Al. Alternately, the first electrode can be absorbing. Since the device is a top emitting device, light exits the device in the direction opposite of the substrate 200 so that the fist electrode 260 can be formed above circuit components such as drive transistor 150. This configuration makes most efficient use of the available surface area of the substrate. Alternately, if a bottom emitting device is to be constructed, the first electrode should be transparent and can be constructed of a material such as ITO. In this case, the first electrode should also be formed in an area that is not above other circuit components, which are opaque and block light emission that is directed toward the substrate.

Above first electrode 260, an interpixel dielectric 220 layer, such as is described in U.S. Pat. No. 6,246,179, is preferably used to cover the edges of the first electrodes in order to prevent shorts or strong electric fields in this area. While use of the interpixel dielectric 220 layer is preferred, it is not required for successful implementation of the present invention.

Each of the pixels further includes an organic EL media 240 from which organic light emitting diodes are formed. There are numerous configurations of the organic EL media 240 layers wherein the present invention can be successfully practiced. A broadband or white light source, which emits light at the wavelengths used by all the pixels, is preferred to avoid the need for patterning the organic EL medium between pixels. In this case, color filters (not shown) can be provided for the pixels in the path of the light to produce the desired light colors from the white or broadband emission for a multicolor device. Some examples of organic EL media layers that emit broadband or white light are described, for example, in U.S. Pat. No. 6,696,177. However, the present invention can also be made to work where each pixel has one or more of the organic EL medium layers separately patterned for each pixel to emit differing colors for specific pixels. The organic EL media 240 is constructed of several layers such as a hole injecting layer 241, a hole transporting layer 242 that is disposed over the hole injecting layer 241, a light emitting layer 243 disposed over the hole transporting layer 242, and an electron transporting layer 245 disposed over the light emitting layer 243. Alternate constructions of the organic EL media 240 having fewer or more layers can also be used to successfully practice the present invention. These organic EL medium layers are typically comprised of organic materials, which are either small molecule materials or polymer materials as known in the art. These organic EL medium layers can be deposited by several methods known in the art such as, for example, thermal evaporation in a vacuum chamber, laser transfer from a donor substrate, or deposition from a solvent by use of an ink jet print apparatus.

Above the organic EL media 240, a second electrode 250 is formed. For a top emitting device, this electrode needs to be highly transparent. As such, materials which are conductive and transparent, such as indium tin oxide (ITO), are preferred for the second electrode 250. However, for alternate embodiments where the device is a bottom emitting device, materials which are reflective such as aluminum (Al) or magnesium silver (MgAg) can be used.

When stimulated by an electrical current between first electrode 260 and second electrode 250, the organic EL media 240 produces light emission 270. As shown in FIG. 3, the light emission 270 exits the device in a direction opposite to the substrate 200 thereby operating as a top emitting device.

Figure 4:
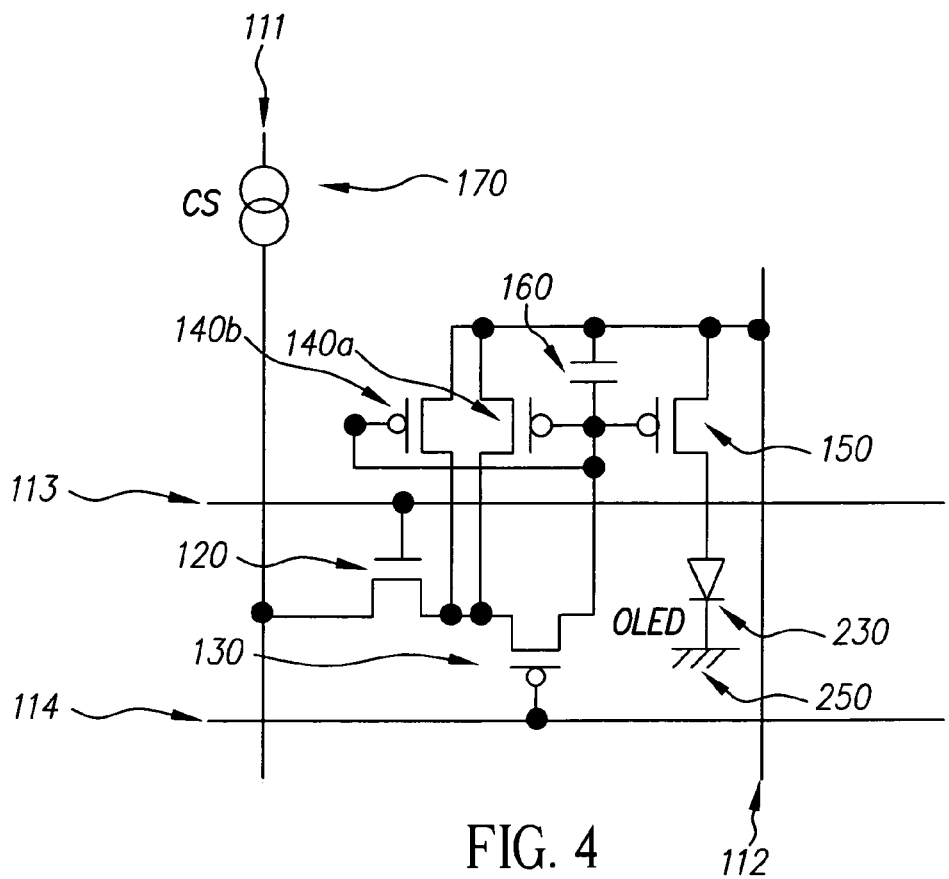
FIG. 4 shows a schematic circuit diagram of a pixel according to the second layout embodiment of the present invention.

FIG. 4 shows a current type active matrix circuit for driving an OLED device. More particularly, this diagram depicts an active matrix, current mirror type circuit according to the second layout embodiment of the present invention. In this second layout embodiment, the circuit can again be arranged into a matrix of pixels, which are arranged into rows and columns. In FIG. 4, the circuit portion of a single pixel is shown, however, this design can be expanded to many rows and columns as previously described for the first layout embodiment. Each pixel is an area of the device that can be independently stimulated to produce light. Each column includes a data line, such as data line 111 that is connected to a current source, such as current source 170. This current source can be fabricated on the same substrate as the pixels or fabricated externally and connected to the data line 111. Each column also includes a power line such as power line 112. Alternately, neighboring columns of pixels can be arranged to share a single power line. In yet another alternate arrangement, these power lines can be arranged to run perpendicular to the data lines or in the direction of the rows. Each row includes a first scan line such as first scan line 113 and a second scan line such as second scan line 114. Each pixel further includes five transistors, a capacitor, and an organic light emitting diode. For example, the pixel shown includes select transistor 120, switch transistor 130, first conversion transistor 140a, second conversion transistor 140b, drive transistor 150, storage capacitor 160, and organic light emitting diode 230.

The select transistor 120 is electrically connected at its gate terminal to the first scan line 113 and is electrically connected at either its source or drain terminal to the data line 111. The function of the select transistor is to permit the data, which is supplied in the form of a current signal, to pass from the data line to the other circuit components when the select transistor is turned on by the appropriate voltage on the first scan line. In doing so, the current flow through the drive transistor, and therefore the organic light emitting diode, is adjusted thereby adjusting the brightness of the pixel. The select transistor can also be referred to as the input transistor.

The switch transistor 130 is electrically connected at its gate terminal to the second scan line 114 and at its second terminal to the select transistor 120 and at its third terminal to the storage capacitor 160, the gate terminal of the drive transistor 150, the gate terminal of the first conversion transistor 140a, and the gate terminal of the second conversion transistor 140b as shown. The purpose of the switch transistor is to permit the gate terminals of the drive and conversion transistors as well as the storage capacitor to charge to the desired brightness when the data signal is being written to the pixel. This is accomplished by applying the appropriate voltage to the gate terminal of the switch transistor by means of the second scan line to turn the switch transistor on. After the data signal has been written, the switch transistor is turned off, by applying an appropriate voltage to the second scan line, thereby isolating the voltage stored on the storage capacitor and the gate terminals of the conversion and drive transistors. The switch transistor can also be referred to as the erase transistor.

The conversion transistor of the first layout embodiment has been replaced by a first conversion transistor 140a and a second conversion transistor 140b in the second layout embodiment. The first conversion transistor 140a and second conversion transistor 140b are connected in parallel with their source terminals electrically connected and drain terminals electrically connected. The gate terminals of the first conversion transistor 140a and second conversion transistor 140b are also electrically connected. As such, the first conversion transistor 140a and second conversion transistor 140b together serve the function in the second layout embodiment of the conversion transistor of the first layout embodiment.

The first conversion transistor 140a and the second conversion transistor 140b are electrically connected at their gate terminals to the storage capacitor 160 and the gate terminal of the drive transistor 150 as well as the source or drain terminal of the switch transistor 130 as shown. The first conversion transistor 140a and the second conversion transistor 140b are also electrically connected to the power line 112 and to the select transistor 120 and the switch transistor 130 as shown. The purpose of the conversion transistors is to pass the current supplied by the data line and to mirror the current onto the drive transistor by electrically connecting the gates of the conversion transistors to the gate of the drive transistor.

As with the first layout embodiment, the current flow through the conversion transistors can be the same as that which flows through the drive transistor, or it can be made to be a ratio of the current flowing through the drive transistor. However, it is preferable that the current through the drive transistor is not identical, but instead a ratio of the data line current. It is preferable, for example, that a higher current is supplied by the data line so that the storage capacitor and other capacitances, such as parasitic capacitances, are quickly charged thereby reducing the time required to establish the desired brightness level of the pixel. This is achieved by adjusting the ratios of one or more of the features of the conversion and drive transistors such as the ratio of the channel lengths, channel widths, and gate insulator thickness. For this purpose, since there are two conversion transistors connected in parallel, each conversion transistor will carry approximately half of the total current flow through the conversion transistors if the conversion transistors are identical in terms of channel width, channel length, and other features. Alternately, the features, such as channel width, of the two conversion transistors can be made to differ, such that the total current is divided between the two conversions transistors in a non-equal manner. Therefore, these two transistors should be considered together in establishing the proper ratio of current flows between the conversion transistors and the drive transistor. For example, if the gate width of the first conversion transistor and the gate width of the second conversion transistor are both made to be a factor of five times larger that of the gate width of the drive transistor while the other features were made to be equivalent, then a current of approximately ten times greater than that which is required by the organic light emitting diode to achieve the desired pixel brightness can be used to write the pixel data. After the brightness level has been adjusted to the desired level and the select transistor and switch transistors are turned off, the current flow through the conversion transistors ceases and they no longer serve a current mirror function. However, because the voltage at the gate terminal of the drive transistor is stored on the storage capacitor and isolated by the switch transistor, the pixel continues to emit at the desired brightness with the drive transistor supplying the required current. This continues until the pixel is again adjusted during the next image frame.

The drive transistor 150 is electrically connected at its gate terminal to the storage capacitor 160 and the gate terminals of the first conversion transistor 140a and the second conversion transistor 140b as well as the source or drain terminal of the switch transistor 130. The drive transistor is electrically connected at its second terminal to the power line 112 and at its third terminal to the organic light emitting diode 230 as shown. The purpose of the drive transistor is to regulate current flow through the organic light emitting diode in response to data signal from the data line. In this case, the regulated current flow can be some ratio of that supplied by the data line as converted by the conversion transistors as described above. The drive transistor can also be referred to as a power transistor.

Each pixel includes an organic light emitting diode, such as organic light emitting diode 230. These diodes are composed of organic light emitting layers disposed between a first and second electrode. The first electrode is connected to drive transistor 150. The second electrode 250 is preferably common to all the pixels. One or more of the organic light emitting layers can be individually patterned for each pixel, or can be common to all the pixels as well.

The first scan line 113 and second scan line 114 are used to turn on the select transistor 120 and switch transistor 130, respectively, permitting the pixel to adjust in brightness in response to the data signal from the data line 111 during a write period of the device frame. After the brightness level is established, the first scan line and second scan line are set to turn off the select and switch transistors for their associated row of pixels. The data line signal is then adjusted to the desired level for the next row, and then the first scan line and second scan line for that next row are activated. This process is repeated for each row of pixels. In this configuration, the select transistor is shown to be an NMOS type transistor and the conversion transistors, the drive transistor, and the switch transistor are shown to be PMOS type transistors. However, the present invention is not limited to this case and these transistor types can be reconfigured by someone skilled in the art. In alternate designs, particularly where the select transistor and switch transistor are made to both be NMOS or PMOS type transistors, a single scan line can serve the function of both the first scan line and second scan line.

Figure 5:
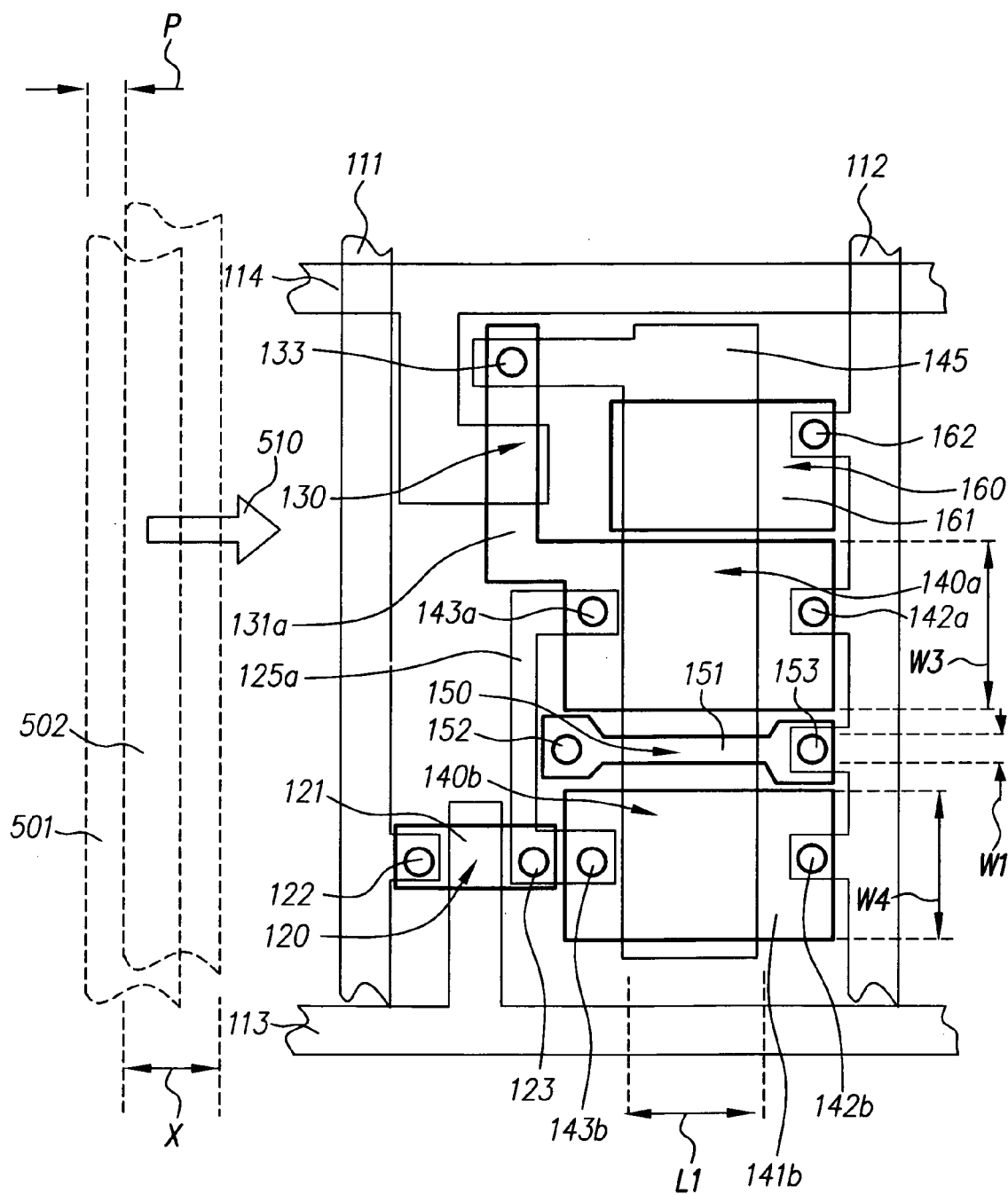
FIG. 5 shows a circuit layout diagram of a pixel according to the second layout embodiment of the present invention.

FIG. 5 shows an exemplary circuitry layout diagram for a single pixel according to the second layout embodiment of the present invention. In FIG. 5, the construction and the arrangement of the various circuit components such as the select transistor 120, the switch transistor 130, the first conversion transistor 140a, the second conversion transistor 140b, the drive transistor 150, the storage capacitor 160, the data line 111, the power line 112, the first scan line 113, and the second scan line 114 are shown. The organic light emitting diode, including its first electrode and second electrode are not shown in FIG. 5.

As shown in FIG. 5, the drive transistor 150 is constructed so that its channel region under the gate conductor 145 has a width W1 and a length L1. The first conversion transistor 140a is constructed so that its channel region under the gate conductor 145 has a width W3 and a length L1. The second conversion transistor 140b is constructed so that its channel region under the gate conductor 145 has a width W4 and a length L1.

According to the second layout embodiment, the channel region of the first conversion transistor 140a and the channel region of the second conversion transistor 140b are spaced apart with the channel region of the drive transistor 150 disposed between them. In order to achieve this layout, the conversion transistors can be formed from two different semiconductor regions. For example, first conversion transistor 140a is formed from semiconductor region 131a, and the second conversion transistor 140b is formed from semiconductor region 141b. Electrical connection is made between the first conversion transistor 140a, the second conversion transistor 140b, the select transistor 120, and the switch transistor 130 by means of conductor bridge 125a. Conductor bridge 125a is electrically connected to semiconductor region 131a and to semiconductor region 141b through via 143a and via 143b, respectively. Electrical connection is made between the first conversion transistor 140a and power line 112 through via 142a. Electrical connection is made between the second conversion transistor 140b and power line 112 through via 142b. Gate conductor 145 serves as the gate electrode for first conversion transistor 140a, second conversion transistor 140b, and drive transistor 150.

By disposing the channel region of the drive transistor 150 between the channel region of the first conversion transistor 140a and the channel region of the second conversion transistor 140b according to the second layout embodiment of the present invention, the circuit becomes more robust to local variations in the physical properties of the layers, such as the semiconductor layer and the insulating layer between the semiconductor layer and the gates. These physical properties, such as, for example, gate insulator thickness and crystal grain size directly influence the electrical properties of the transistors such as, for example, threshold voltage and carrier mobility. That is, by disposing the channel region of the drive transistor 150 between the channel region of the first conversion transistor 140a and the channel region of the second conversion transistor 140b, the properties of drive transistor 150 approach a midpoint value of the properties of the first conversion transistor 140a and the second conversion transistor 140b. Since first conversion transistor 140a and the second conversion transistor 140b are electrically connected in parallel, with their gates also electrically connected, the total current flow, or a ratio thereof, from these conversion transistor will be mirrored on to the drive transistor 150 when the data signal is written to the row of pixels as described previously. By constructing drive transistor 150 so as to have approximately the midpoint value of the properties of the first conversion transistor 140a and the second conversion transistor 140b according to the second layout embodiment, overall robustness to variability in such properties is improved.

In the case where the semiconductor layer is crystallized by annealing with a laser as described previously, robustness is also improved by practice of the second layout embodiment of the present invention. However, the second layout embodiment of the present invention is not limited to this case. In the case where the semiconductor layer is crystallized by annealing with a laser, it is desirable to improve robustness of the circuit to variability of the laser pulses which in turn affect the properties of the semiconductor layer. In order to reduce sensitivity of the circuit to variability of the energy of the laser pulses, such as laser pulse 501 and laser pulse 502, the channel region of the first conversion transistor 140a, the channel region of the drive transistor 150, and the channel region of the second conversion transistor 140b are also preferably disposed parallel to the laser pulses as shown. By disposing the channel region of the drive transistor 150 between the channel region of the first conversion transistor 140a and the channel region of the second conversion transistor 140b in this parallel arrangement, robustness to variability in the energy of the laser along the length of the pulses is improved by providing the channel region of drive transistor 150 with approximately an average value of the laser energy received by the channel region of the first conversion transistor 140a and by the channel region of the second conversion transistor 140b.

In order to further reduce variability between the semiconductor regions in the channel regions of the first conversion transistor 140a, the second conversion transistor 140b and the drive transistor 150 when annealing the semiconductor layer using a laser, these regions should be crystallized by the same laser pulse or series of laser pulses. As such, the channel regions of the first conversion transistor 140a, the second conversion transistor 140b, and the drive transistor 150 are disposed with respect to the laser pulses such that they are both within the length of a pulse and annealed by the same series of pulses at the same instance. The channel regions of the first conversion transistor 140a, the second conversion transistor 140b, and the drive transistor 150 are also disposed such that as the series of pulses traverses the channel regions as indicated by the scan direction 510, the series of pulses will reach all the channel regions at approximately the same instant and finish annealing all the channel regions at approximately the same instant. This can be achieved, for example, by disposing the channel regions as shown such that either the length or the width of channel regions are perpendicular to the laser pulses and so that the channel regions are appropriately aligned to each other. In order to achieve this alignment of the channel regions of the first conversion transistor 140a, the second conversion transistor 140b, and the drive transistor 150, it is preferable that either the length or the width of first conversion transistor 140a, the second conversion transistor 140b, and the drive transistor 150 are made to be the same. As shown in the example of FIG. 5, the channel lengths of the channel regions of the first conversion transistor 140a, the second conversion transistor 140b and the drive transistor 150 are made to be the same, while the channel widths of these regions are made to be different. While it is preferable that the channel regions are annealed by exactly the same series of pulses, some benefit can still be achieved by disposing these channel regions such that at least a portion of each of the channel regions, preferably more than 50%, are simultaneously annealed by the same pulses.

Figure 6:
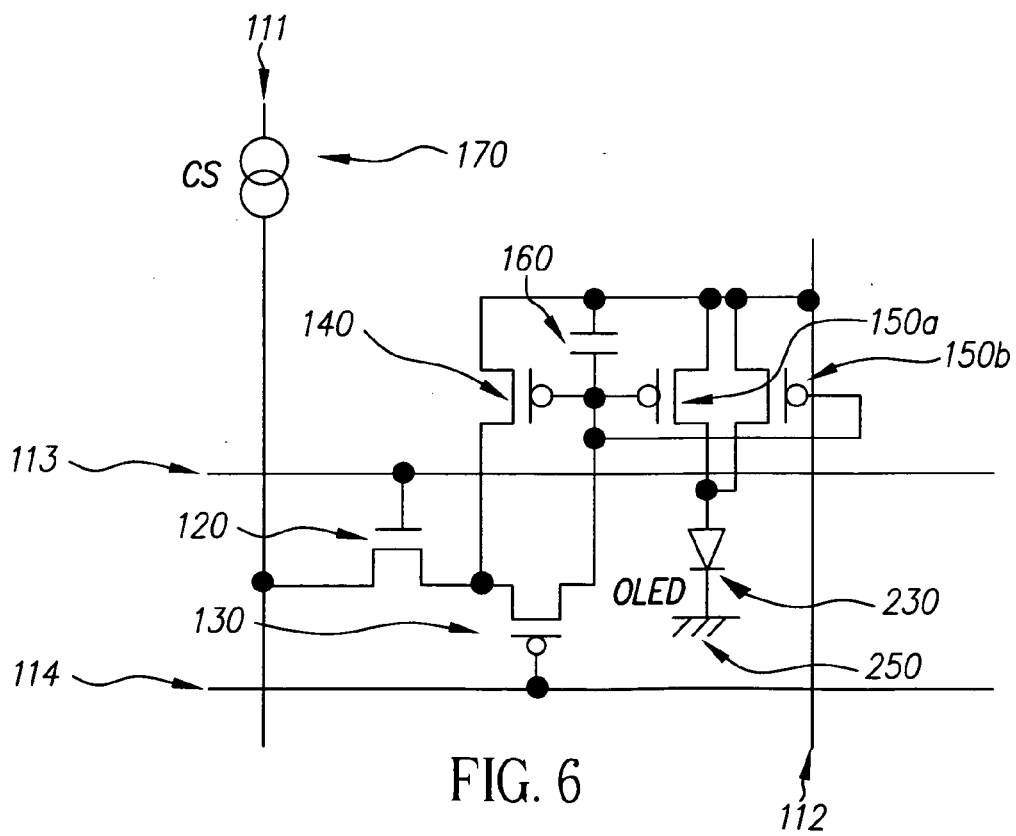
FIG. 6 shows a schematic circuit diagram of a pixel according to the third layout embodiment of the present invention.

FIG. 6 shows another current type active matrix circuit for driving an OLED device. More particularly, this diagram depicts an active matrix, current mirror type circuit according to the third layout embodiment of the present invention. In this third layout embodiment, the circuit can again be arranged into a matrix of pixels which are arranged into rows and columns. In FIG. 6, the circuit portion of a single pixel is shown, however, this design can be expanded to many rows and columns as previously described for the first layout embodiment. Each pixel is an area of the device that can be independently stimulated to produce light. Each column includes a data line, such as data line 111 that is connected to a current source, such as current source 170. This current source can be fabricated on the same substrate as the pixels or fabricated externally and connected to the data line 111. Each column also includes a power line such as power line 112. Alternately, neighboring columns of pixels can be arranged to share a single power line. In yet another alternate arrangement, these power lines can be arranged to run perpendicular to the data lines or in the direction of the rows. Each row includes a first scan line such as first scan line 113 and a second scan line such as second scan line 114. Each pixel further includes five transistors, a capacitor, and an organic light emitting diode. For example, the pixel shown includes select transistor 120, switch transistor 130, conversion transistor 140, first drive transistor 150a, second drive transistor 150b, storage capacitor 160, and organic light emitting diode 230.

The select transistor 120 is electrically connected at its gate terminal to the first scan line 113 and is electrically connected at either its source or drain terminal to the data line 111. The function of the select transistor is to permit the data, which is supplied in the form of a current signal, to pass from the data line to the other circuit components when the select transistor is turned on by the appropriate voltage on the first scan line. In doing so, the current flow through the drive transistor, and therefore the organic light emitting diode, is adjusted thereby adjusting the brightness of the pixel. The select transistor can also be referred to as the input transistor.

The switch transistor 130 is electrically connected at its gate terminal to the second scan line 114 and at its second terminal to the select transistor 120 and at its third terminal to the storage capacitor 160, the gate terminal of the first drive transistor 150a, the gate terminal of the second drive transistor 150b, and the gate terminal of the conversion transistor 140 as shown. The purpose of the switch transistor is to permit the gate terminals of the drive and conversion transistors, as well as the storage capacitor, to charge to the desired brightness when the data signal is being written to the pixel. This is accomplished by applying the appropriate voltage to the gate terminal of the switch transistor by means of the second scan line to turn the switch transistor on. After the data signal has been written, the switch transistor is turned off by applying an appropriate voltage to the second scan line, thereby isolating the voltage stored on the storage capacitor and the gate terminals of the conversion and drive transistors. The switch transistor can also be referred to as the erase transistor.

The drive transistor of the first layout embodiment has been replaced by a first drive transistor 150a and a second drive transistor 150b in the third layout embodiment. The first drive transistor 150a and second drive transistor 150b are connected in parallel with their source terminals electrically connected and drain terminals electrically connected. The gate terminals of the first drive transistor 150*a* and second drive transistor 150*b* are also electrically connected. As such, the first drive transistor 150*a* and second drive transistor 150*b* together serve the function in the third layout embodiment of the drive transistor of the first layout embodiment.

The first drive transistor 150*a* and second drive transistor 150*b* are electrically connected at their gate terminals to the storage capacitor 160 and the gate terminal of the conversion transistor, as well as to the source or drain terminal of the switch transistor 130. The first drive transistor 150*a* and second drive transistor 150*b* are electrically connected at their second terminals to the power line 112, and at their third terminals to the organic light emitting diode 230 as shown. The purpose of the drive transistors is to regulate current flow through the organic light emitting diode in response to data signal from the data line. In this case, the regulated current flow can be some ratio of that supplied by the data line as converted by the conversion transistor as described below. The drive transistor can also be referred to as a power transistor.

The conversion transistor 140 is electrically connected at its gate terminal to the storage capacitor 160, the gate terminal of the first drive transistor 150*a*, the gate terminal of the second drive transistor 150*b*, as well as to the source or drain terminal of the switch transistor 130. The second terminal of the conversion transistor is electrically connected to the power line 112 and third terminal is electrically connected to the source or drain of the select transistor 120 and the switch transistor 130 as shown. The purpose of the conversion transistor is to pass the current supplied by the data line and to mirror the current onto the drive transistors by electrically connecting the gate of the conversion transistor to the gates of the drive transistors.

As with the first layout embodiment, the current flow through the conversion transistor can be the same as the total current flow through the drive transistors, or it can be made to be a ratio of the total current flow through the drive transistors. However, it is preferable that the current through the drive transistors is not identical, but instead a ratio of the data line current. It is preferable, for example, that a higher current is supplied by the data line so that the storage capacitor and other capacitances, such as parasitic capacitances, are quickly charged, thereby reducing the time required to establish the desired brightness level of the pixel. This is achieved by adjusting the ratios of one or more of the features of the conversion and drive transistors such as the ratio of the channel lengths, channel widths, and gate insulator thickness. For this purpose, since there are two drive transistors connected in parallel, each drive transistor will carry approximately half of the total current flow through the drive transistors if the drive transistors are identical in terms of channel width, channel length, and other features. Alternately, the features, such as channel width, of the two drive transistors can be made to differ, such that the total current is divided between the two drive transistors in a non-equal manner. Therefore, these two drive transistors should be considered together in establishing the proper ratio of current flows between the conversion transistor and the drive transistors. For example, if the gate width of the first drive transistor and the gate width of the second drive transistor are both made to be a factor of twenty times smaller than that of the gate width of the conversion transistor while the other features were made to be equivalent, then a current of approximately ten times greater than that which is required by the organic light emitting diode to achieve the desired pixel brightness can be used to write the pixel data. After the brightness level has been adjusted to the desired level and the select transistor and switch transistors are turned off, the current flow through the conversion transistor ceases and it no longer serves a current mirror function. However, because the voltage at the gate terminals of the drive transistors is stored on the storage capacitor and isolated by the switch transistor, the pixel continues to emit at the desired brightness with the drive transistors supplying the required current. This continues until the pixel is again adjusted during the next image frame.

Each pixel includes an organic light emitting diode, such as organic light emitting diode 230. These diodes are composed of organic light emitting layers disposed between a first and second electrode. The first electrode is connected to first drive transistor 150*a* and second drive transistor 150*b*. The second electrode 250 is preferably common to all the pixels. One or more of the organic light emitting layers can be individually patterned for each pixel, or can be common to all the pixels as well.

The first scan line 113 and second scan line 114 are used to turn on the select transistor 120 and switch transistor 130, respectively, permitting the pixel to adjust in brightness in response to the data signal from the data line 111 during a write period of the device frame. After the brightness level is established, the first scan line and second scan line are set to turn off the select and switch transistors for their associated row of pixels. The data line signal is then adjusted to the desired level for the next row, and then the first scan line and second scan line for that next row are activated. This process is repeated for each row of pixels. In this configuration, the select transistor is shown to be an NMOS type transistor and the conversion transistor, the drive transistors, and the switch transistor are shown to be PMOS type transistors. However, the present invention is not limited to this case and these transistor types can be reconfigured by someone skilled in the art. In alternate designs, particularly where the select transistor and switch transistor are made to both be NMOS or PMOS type transistors, a single scan line can serve the function of both the first scan line and second scan line.

Figure 7:
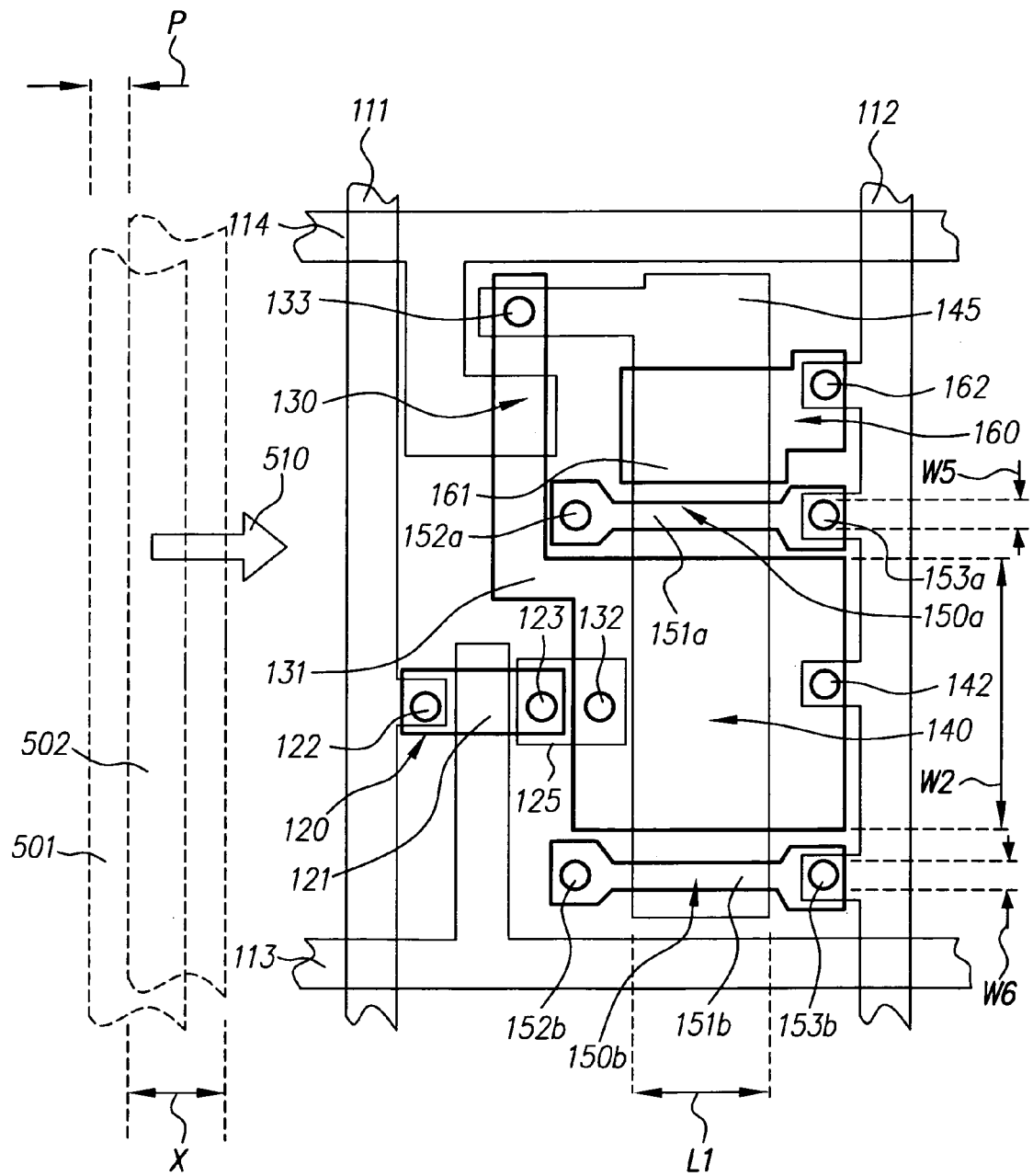
FIG. 7 shows a circuit layout diagram of a pixel according to the third layout embodiment of the present invention.

FIG. 7 shows an exemplary circuitry layout diagram for a single pixel according to the third layout embodiment of the present invention. In FIG. 7, the construction and the arrangement of the various circuit components such as the select transistor 120, the switch transistor 130, the conversion transistor 140, the first drive transistor 150*a*, the second drive transistor 150*b*, the storage capacitor 160, the data line 111, the power line 112, the first scan line 113, and the second scan line 114 are shown. The organic light emitting diode, including its first electrode and second electrode, are not shown in FIG. 7.

As shown in FIG. 7, the conversion transistor 140 is constructed so that its channel region under the gate conductor 145 has a width W2 and a length L1. The first dive transistor 150*a* is constructed so that its channel region under the gate conductor 145 has a width W5 and a length L1. The second drive transistor 150*b* is constructed so that its channel region under the gate conductor 145 has a width W6 and a length L1.

According to the third layout embodiment, the channel region of the first drive transistor 150*a* and the channel region of the second drive transistor 150*b* are spaced apart with the channel region of the conversion transistor 140 disposed between them. In order to achieve this layout, the drive transistors can be formed from two different semiconductor regions. For example, first drive transistor 150a is formed from semiconductor region 151a, and the second drive transistor 150b is formed from semiconductor region 151b. Electrical connection is made between the first drive transistor 150a and power line 112 through via 153a. Electrical connection is made between the second drive transistor 150b and power line 112 through via 153b. Electrical connection is made between the first drive transistor 150a and the first electrode of the organic light emitting diode (not shown) through via 152a. Electrical connection is made between the second drive transistor 150b and the first electrode of the organic light emitting diode (not shown) through via 152b. Gate conductor 145 serves as the gate electrode for first drive transistor 150a, second drive transistor 150b, and conversion transistor 140.

By disposing the channel region of the conversion transistor 140 between the channel region of the first drive transistor 150a and the channel region of the second drive transistor 150b, according to the third layout embodiment of the present invention, the circuit becomes more robust to local variations in the physical properties of the layers, such as the semiconductor layer and the insulating layer between the semiconductor layer and the gates. These physical properties, such as, for example, gate insulator thickness and crystal grain size, directly influence the electrical properties of the transistors such as, for example, threshold voltage and carrier mobility. That is, by disposing the channel region of the conversion transistor 140 between the channel region of the first drive transistor 150a and the channel region of the second drive transistor 150b, the properties of conversion transistor 140 approach a midpoint value of the properties of the first drive transistor 150a and the second drive transistor 150b. Since first drive transistor 150a and the second drive transistor 150b are electrically connected in parallel, with their gates also electrically connected, the current flow, or a ratio thereof, from the conversion transistor will be mirrored these drive transistors and divided between them when the data signal is written to the row of pixels as described previously. By constructing conversion transistor 140 so as to have approximately the midpoint value of the properties of the first drive transistor 150a and the second drive transistor 150b according to the third layout embodiment, overall robustness to variability in such properties is improved.

In the case where the semiconductor layer is crystallized by annealing with a laser as described previously, robustness is also improved by practice of the third layout embodiment of the present invention. However, the third layout embodiment of the present invention is not so limited. In the case where the semiconductor layer is crystallized by annealing with a laser, it is desirable to improve robustness of the circuit to variability of the laser pulses which, in turn, affect the properties of the semiconductor layer. In order to reduce sensitivity of the circuit to variability of the energy of the laser pulses, such as laser pulse 501 and laser pulse 502, the channel region of the first drive transistor 150a, the channel region of the conversion transistor 140, and the channel region of the second drive transistor 150b are also preferably disposed parallel to the laser pulses as shown. By disposing the channel region of the conversion transistor 140 between the channel region of the first drive transistor 150a and the channel region of the second drive transistor 150b in this parallel arrangement, robustness to variability in the energy of the laser along the length of the pulses is improved by providing the channel region of conversion transistor 140 with approximately a midpoint value of the laser energy received by the channel region of the first drive transistor 150a and by the channel region of the second drive transistor 150b.

In order to further reduce variability between the semiconductor regions in the channel regions of the first drive transistor 150a, the second drive transistor 150b, and the conversion transistor 140 when annealing the semiconductor layer using a laser, these regions should be crystallized by the same laser pulse or series of laser pulses. As such, the channel regions of the first drive transistor 150a, the second drive transistor 150b, and the conversion transistor 140 are disposed with respect to the laser pulses such that they are both within the length of a pulse and annealed by the same series of pulses at the same instance. The channel regions of the conversion transistor 140, the first drive transistor 150a, and the second drive transistor 150b are also disposed such that as the series of pulses traverses the channel regions, as indicated by the scan direction 510, the series of pulses will reach all the channel regions at approximately the same instant and finish annealing all the channel regions at approximately the same instant. This can be achieved, for example, by disposing the channel regions as shown such that either the length or the width of channel regions are perpendicular to the laser pulses and so that the channel regions are appropriately aligned to each other. In order to achieve this alignment of the channel regions of the first drive transistor 150a, the second drive transistor 150b and the conversion transistor 140, it is preferable that either the length or the width of first drive transistor 150a, the second drive transistor 150b, and the conversion transistor 140 are made to be the same. As shown in the example of FIG. 7, the channel lengths of the channel regions of the first drive transistor 150a, the second drive transistor 150b, and the conversion transistor 140 are made to be the same while the channel widths of these regions are made to be different. While it is preferable that the channel regions are annealed by exactly the same series of pulses, some benefit can still be achieved by disposing these channel regions such that at least a portion of each of the channel regions, preferably more than 50%, are simultaneously annealed by the same pulses.

The second layout embodiment was described with a drive transistor disposed between two conversion transistors. This concept can be expanded by one skilled in the art to three or more conversion transistors with at least one drive transistor disposed between at least two of such conversion transistors. Such embodiments are viewed as being within the scope of the invention. The third layout embodiment was described with a conversion transistor disposed between two drive transistors. This concept can be expanded by one skilled in the art to three or more drive transistors with at least one conversion transistor disposed between at least two of such drive transistors. Such embodiments are also viewed as being within the scope of the invention. Combinations of such embodiments having two or more drive transistors and two or more conversion transistors are also achievable by one skilled in the art, and such combinations are also viewed as being within the scope of the invention. Any of these aforementioned configurations would permit for further robustness to variability in the transistor properties.

The invention has been described in detail with particular reference to certain preferred embodiments thereof, but it will be understood that variations and modifications can be effected within the spirit and scope of the invention.

PARTS LIST 10 pixel
111 data line
112 power line
113 first scan line
114 second scan line
120 select transistor
121 semiconductor region
122 via
123 via
125 conductor bridge
125a conductor bridge
130 switch transistor
131 semiconductor region
131a semiconductor region
132 via
133 via
140 conversion transistor
140a first conversion transistor
140b second conversion transistor
141b semiconductor region
142 via
142a via
142b via
143a via
143b via
145 gate conductor
150 drive transistor
150a first drive transistor
150b second drive transistor
151 semiconductor region
151a semiconductor region
151b semiconductor region
152 via
152a via
152b via
153 via
153a via
153b via
160 storage capacitor
161 semiconductor region
162 via
170 current source
200 substrate
212 first dielectric layer
213 second dielectric layer
214 third dielectric layer
230 organic light emitting diode
240 organic EL media
241 hole injecting layer
242 hole transporting layer
243 light emitting layer
245 electron transporting layer
250 second electrode
260 first electrode
270 light emission
501 laser pulse
502 laser pulse
510 laser scan direction

The invention claimed is:

1. A method of making a current type active matrix OLED device, comprising:
   a) providing a semiconductor layer over a substrate;
   b) providing a conductive layer over the substrate;
   c) providing an insulator layer between the semiconductor layer and the conductive layer;
   d) providing an organic light emitting diode over either the semiconductor layer or over the conductive layer for each pixel for producing light emission;
   e) forming a first transistor having a channel region formed in the semiconductor layer and a gate formed in the conductive layer for each pixel for receiving a first current data signal for adjusting the emission brightness in its corresponding pixel;
   f) forming a second transistor for each pixel for regulating current through the organic light emitting diode in response to the first current wherein each second transistor has a gate formed in the conductive layer and a channel region formed in the semiconductor layer; and
   g) annealing regions of the semiconductor layer before or after formation of the first and second transistors by using a pulsed laser providing one or more laser pulses provided by a source that irradiates such regions of the semiconductor layer associated with a portion of the channel region of the first transistor and a portion of the channel region of the second transistor.

2. The method according to claim 1 wherein relative motion is provided between the source and the substrate so that, as pulses are provided, they simultaneously irradiate the portions of the channel regions of the first and second transistors.

3. The method according to claim 1 wherein each irradiated portion has an area greater than 50% of its corresponding channel region.

4. The method according to claim 1 wherein each irradiated portion has an area equal to 100% of its corresponding channel region.

5. A method of making a current type active matrix OLED device, comprising:
   a) providing a semiconductor layer over a substrate;
   b) providing a conductive layer over the substrate;
   c) providing an insulator layer between the semiconductor layer and the conductive layer;
   d) providing an organic light emitting diode over either the semiconductor layer or over the conductive layer for each pixel for producing light emission;
   e) forming a first transistor having a channel region formed in the semiconductor layer and a gate formed in the conductive layer for each pixel for receiving a first current data signal for adjusting the emission brightness in its corresponding pixel;
   f) forming a second transistor and a third transistor for each pixel for regulating current through the organic light emitting diode in response to the first current wherein the second transistor and third transistor each have a gate formed in the conductive layer and a channel region formed in the semiconductor layer; and
   g) annealing regions of the semiconductor layer before or after formation of the first, second, or third transistors by using a pulsed laser providing one or more laser pulses provided by a source that irradiates such regions of the semiconductor layer associated with a portion of the channel region of the first transistor, a portion of the channel region of the second transistor, and a portion of the channel region of the third transistor.

6. The method according to claim 5 wherein relative motion is provided between the source and the substrate so that, as pulses are provided, they simultaneously irradiate the portions of the channel regions of the first, second, and third transistors.

7. The method according to claim 5 wherein each irradiated portion has an area greater than 50% of its corresponding channel region.

8. The method according to claim 5 wherein each irradiated portion has an area equal to 100% of its corresponding channel region.

9. A method of making a current type active matrix OLED device, comprising:
   a) providing a semiconductor layer over a substrate;
   b) providing a conductive layer over the substrate;
   c) providing an insulator layer between the semiconductor layer and the conductive layer;
   d) providing an organic light emitting diode over either the semiconductor layer or over the conductive layer for each pixel for producing light emission;
   e) forming a first and second transistor each having a channel region formed in the semiconductor layer and a gate formed in the conductive layer for each pixel for receiving a first current data signal for adjusting the emission brightness in its corresponding pixel;
   f) forming a third transistor for each pixel for regulating current through the organic light emitting diode in response to the first current wherein the third transistor has a gate formed in the conductive layer and a channel region formed in the semiconductor layer; and
   g) annealing regions of the semiconductor layer before or after formation of the first, second, or third transistors by using a pulsed laser providing one or more laser pulses provided by a source that irradiates such regions of the semiconductor layer associated with a portion of the channel region of the first transistor, a portion of the channel region of the second transistor, and a portion of the channel region of the third transistor.

10. The method according to claim 9 wherein relative motion is provided between the source and the substrate so that, as pulses are provided, they simultaneously irradiate the portions of the channel regions of the first, second, and third transistors.

11. The method according to claim 9 wherein each irradiated portion has an area greater than 50% of its corresponding channel region.

12. The method according to claim 9 wherein each irradiated portion has an area equal to 100% of its corresponding channel region.

* * * * *